United States Patent [19]
Ostop et al.

[11] Patent Number: 5,851,852
[45] Date of Patent: Dec. 22, 1998

[54] DIE ATTACHED PROCESS FOR SIC

[75] Inventors: John A. Ostop, Severna Park; Li-Shu Chen, Ellicott City, both of Md.

[73] Assignee: Northrop Grumman Corporation, Los Angeles, Calif.

[21] Appl. No.: 600,777

[22] Filed: Feb. 13, 1996

[51] Int. Cl.⁶ .................................................. H01L 21/58
[52] U.S. Cl. ........................ 438/106; 438/118; 438/120
[58] Field of Search .................................... 438/106, 118, 438/120

[56] References Cited

U.S. PATENT DOCUMENTS

| | | | |
|---|---|---|---|
| 3,573,568 | 4/1971 | Siegel | 317/234 |
| 4,042,951 | 8/1977 | Robinson et al. | 357/67 |
| 4,457,976 | 7/1984 | Faith, Jr. et al. | 428/457 |
| 4,657,825 | 4/1987 | Kanda et al. | 428/457 |
| 4,978,052 | 12/1990 | Fister et al. | 228/123 |
| 5,008,735 | 4/1991 | Edmond et al. | 357/74 |
| 5,023,147 | 6/1991 | Nakata et al. | 428/627 |
| 5,368,880 | 11/1994 | McKee et al. | 427/125 |

OTHER PUBLICATIONS

Patent Abstract of Japan, Publication No. 07025673, Publication date Jan. 27, 1995 — Nippon Cement Co., Ltd., "Method For Joining Ceramics To Silicon Plate".

Copy of International Search Report dated Jun. 20, 1997, International Appln. No. PCT/US97/01790, international filing date Jan. 31, 1997.

*Primary Examiner*—David Graybill
*Attorney, Agent, or Firm*—Walter G. Sutcliff

[57] ABSTRACT

A die attach procedure for SiC uses the scrubbing technique to bond a SiC die to a package. A first layer is formed on the SiC die. This first layer, preferably of nickel, bonds to the SiC die. A second layer, preferably amorphous silicon, is then formed on the first layer. The second layer bonds to the first layer, and forms a eutectic with the material, usually gold, plating the package when the SiC die is scrubbed onto the package.

11 Claims, 1 Drawing Sheet

DIE ATTACHED PROCESS FOR SIC

BACKGROUND OF THE INVENTION

The present invention relates to die attached SiC and a procedure for attaching a SiC die to a package.

Silicon devices are bonded to packages, typically hermetic packages, to protect the silicon device from the environment. Additionally, the package provides heat sinking to prevent thermal damage of the silicon device. One method of bonding a silicon device to a package is called "scrubbing."

As illustrated in FIG. 1, a vacuum collett 8 picks up a Si chip 6 and scrubs the Si chip 6, called a die or silicon die, back and forth into the package 2 plated in gold 4 at a designated position. This "scrubbing" takes place after heating the gold plated package 2,4 and the silicon die 6 to above 370° C. The scrubbing procedure results in the formation of a Au—Si eutectic which bonds the silicon device to the package.

Unfortunately, a similar reaction does not occur with SiC. The conventional procedure for attaching SiC requires applying a solderable metalization to the back of the SiC chip or SiC die. Then, a Au—Sn or Au—Si solder preform is used to form a joint between the SiC die and the package. Typically, this process requires fixtures to position the SiC die and solder preform on the package, and passing the fixtured SiC die, solder preform and package through a furnace to form the solder joint. Additionally, the joint or bond layer between the SiC die and package is quite thick—on the order of 370,000 to 500,000 A; where A stands for angstroms. Such a thick joint adversely increases the thermal resistance of the SiC-package.

SUMMARY OF THE INVENTION

One object of the present invention is to provide a simple die attach procedure for SiC.

Another object of the present invention is to provide a die attach procedure for SiC which uses the well known scrubbing technique.

A further object of the present invention is to provide a die attach procedure for SiC which forms a thin bond layer.

These and other objects are achieved by a die attach procedure for SiC which includes the steps of providing a SiC die; forming a first layer, preferably a nickel layer, on the SiC die; forming a second layer, preferably an amorphous silicon layer, on the first layer; and scrubbing the Sic die into a package typically plated with gold so that a Au—Si eutectic is formed.

These and other objectives are achieved by die attached SiC which includes a package having a plating, usually gold, formed thereon; a SiC die; a first layer, preferably a nickel layer, bonded to the SiC die; a second layer, preferably an amorphous silicon layer, bonded to the first layer and the package. Preferably, the second layer forms a eutectic with the plating on the package.

Other objects, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various features.

DETAILED DESCRIPTION OF THE PREFERRED EMBODIMENTS

Figure 2:
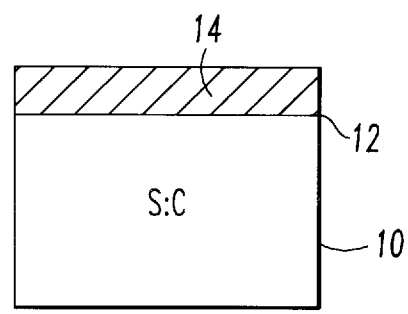
FIGS. 2–3 illustrate the die attach procedure for SiC according to the present invention.

The procedure for die attaching SiC according to the present invention will be described with respect to FIGS. 2–3. As shown in FIG. 2, a layer of nickel (Ni) 14 is deposited on a back surface 12 of a SiC die 10. The nickel layer 14 is deposited to a thickness of 2,000–10,000 A, where A is angstroms. Preferably, the thickness of the nickel layer 14 should be about 5000 A. The nickel layer 14 may be deposited using any well-known deposition technique such as E-beam evaporation.

After depositing the nickel layer 14, the SiC die 10 with the nickel layer 14 is subjected to Rapid Thermal Annealing (RTA) at approximately 950°–1100° C. Annealing causes the nickel layer 14 to react with the SiC die 10. Consequently, annealing provides a good bond between the SiC die 10 and the nickel layer 14 at the atomic level, and provides a good ohmic contact to the SiC die 10 (i.e., reduces the high contact resistance between the SiC die 10 and the nickel layer 14 prior to annealing).

Other methods of annealing, such as furnace annealing, may be used instead of RTA.

Instead of nickel, any material, such as platinum, which bonds to SiC and amorphous silicon (or one of the substitutes for amorphous silicon discussed below) may be used. The substitute for nickel must not, however, be consumed by the Au—Si eutectic discussed in detail below; otherwise, the joint provided between the SiC and amorphous silicon would be destroyed.

Figure 3:
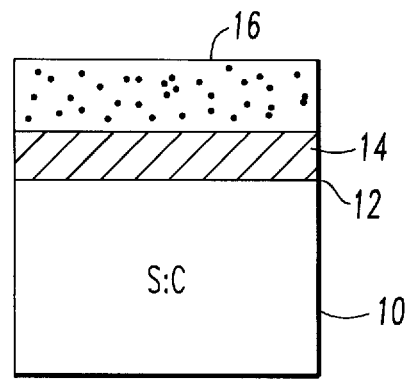

Next, as shown in FIG. 3, an amorphous silicon layer 16 is deposited on the nickel layer 14. The amorphous silicon layer 16 may be deposited using the well known technique of chemical vapor deposition at approximately 400° C. Other deposition techniques such as sputtering, however, may be used.

The amorphous silicon layer 16 is deposited to a thickness of 5,000–30,000 A. Preferably the amorphous silicon layer 16 should have a thickness of 10,000–15,000 A. Because of the nickel layer 14, the amorphous silicon layer 16 bonds to the SiC die 10. In this way, the nickel layer 14 may be thought of as an adhesive layer. Consequently, as discussed above, any other material or compound which bonds to SiC and amorphous silicon may be used instead of nickel.

Furthermore, the die attach procedure of the present invention is not limited to the use of amorphous silicon. Other materials such as tin and germanium, which bond to the adhesive layer and form a eutectic with the plating on the package, may be used. The substitutes for amorphous silicon, preferably, should form a eutectic with the plating on package at a sufficiently low temperature to prevent damage to the SiC device. Amorphous silicon is preferred, though, because amorphous silicon allows high temperature processing of, for example, the SiC wafer while still forming a eutectic with gold at low temperatures.

The procedure according to the present invention is expected to be applied to entire SiC wafers. Therefore, after the application of both the nickel layer and the amorphous silicon layer, the SiC wafer can be further processed, tested and diced into individual chips.

Figure 1:
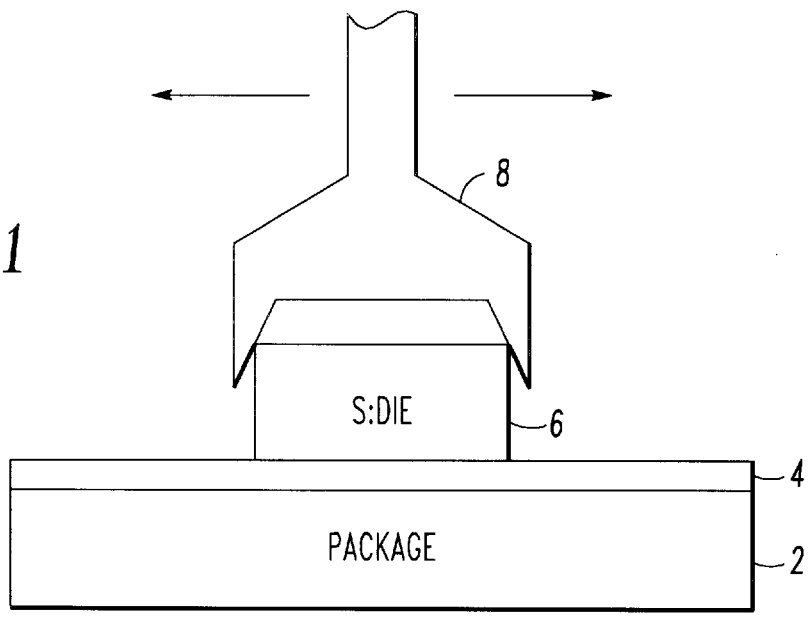
FIG. 1 illustrates the procedure for scrubbing a silicon die into a gold plated package.

Using the scrubbing technique discussed with respect to FIG. 1, the SiC chip or die is scrubbed into a gold plated package. The amorphous silicon layer 16 and the gold plating form a Au—Si eutectic, and bond the SiC die to the package.

The resulting bond layer of nickel, amorphous silicon, and gold is only about 60,000 A thick. This is almost an order of magnitude thinner than conventional soldering techniques. Furthermore, such a thin bond layer minimizes thermal resistance.

Additionally, the present invention utilizes the relatively simple and known scrubbing technique as opposed to the relatively complex solder bonding method which can require expensive fixturing.

Besides gold plated packages, the die attach procedure for SiC according to the present invention can be used with other packages or plated packages which form a eutectic with amorphous silicon or a substitute therefor.

While the present invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

We claim:

1. A die attach procedure for SiC, comprising:
   (a) providing a package with a plating thereon;
   (b) providing a SiC die;
   (c) forming a first layer on said SiC die which bonds to said SiC die;
   (d) forming a second layer on said first layer which bonds to said first layer; and
   (e) scrubbing said SiC die on said package such that said second layer bonds to said package.

2. The procedure of claim 1, wherein said step (c) provides said package having gold plating thereon.

3. The procedure of claim 1, wherein said step (c) forms a nickel layer on said Sic die as said first layer.

4. The procedure of claim 3, wherein said step (c) forms said nickel layer to a thickness of 2,000–10,000 A, where A stands for angstroms.

5. The procedure of claim 1, wherein said step (d) forms an amorphous silicon layer on said first layer as said second layer.

6. The procedure of claim 5, wherein said step (d) forms said amorphous silicon layer to a thickness of 5,000–30,000 A, where A stands for angstroms.

7. The procedure of claim 2, wherein
   said step (d) forms an amorphous silicon layer on said first layer as said second layer; and
   said step (e) scrubs said SiC die on said package such that an Au—Si eutectic is formed.

8. The procedure of claim 7, wherein said step (c) forms a nickel layer on said SiC die as said first layer.

9. The procedure of claim 1, wherein said step (e) scrubs said SiC die on said package such that said plating and said second layer form a eutectic.

10. The procedure of claim 1, wherein said step (d) forms a germanium layer on said first layer as said second layer.

11. The procedure of claim 1, wherein said step (d) forms a tin layer on said first layer as said second layer.

* * * * *